United States Patent
Chang et al.

(10) Patent No.: US 9,426,894 B2
(45) Date of Patent: Aug. 23, 2016

(54) FABRICATION METHOD OF WIRING STRUCTURE FOR IMPROVING CROWN-LIKE DEFECT

(71) Applicant: XINTEC INC., Taoyuan County (TW)

(72) Inventors: Yi-Ming Chang, Taoyuan County (TW); I-Min Lin, Taipei County (TW); Po-Shen Lin, Taoyuan County (TW)

(73) Assignee: XINTEC INC., Taoyuan County (TW)

( * ) Notice: Subject to any disclaimer, the term of this patent is extended or adjusted under 35 U.S.C. 154(b) by 50 days.

(21) Appl. No.: 14/282,457

(22) Filed: May 20, 2014

(65) Prior Publication Data

US 2014/0251946 A1  Sep. 11, 2014

Related U.S. Application Data

(62) Division of application No. 13/300,392, filed on Nov. 18, 2011, now Pat. No. 8,760,882.

(60) Provisional application No. 61/415,079, filed on Nov. 18, 2010.

(51) Int. Cl.
*H05K 3/06* (2006.01)
*H01L 21/48* (2006.01)
(Continued)

(52) U.S. Cl.
CPC ............... *H05K 3/06* (2013.01); *H01L 21/4853* (2013.01); *H01L 21/7685* (2013.01);
(Continued)

(58) Field of Classification Search
CPC ... H05K 3/0017; H05K 3/0073; H05K 3/108; H05K 3/1208; H05K 3/205; H05K 3/06; H05K 3/244; H05K 3/4007; H01L 21/4853; H01L 21/7686; H01L 21/76852; H01L 21/76885; H01L 23/53238; H01L 24/05; H01L 24/11; H01L 24/13; H01L 2201/0367; H01L 2924/00; H01L 2924/00014; H01L 2924/01028; H01L 2924/01029; H01L 2924/01047; H01L 2924/01079; H01L 2924/01082; H01L 2224/02311; H01L 2224/02313; H01L 2224/02317; H01L 2224/02319; H01L 2224/02331; H01L 2224/0235; H01L 2224/0239; H01L 2224/0401; H01L 2224/05548; H01L 2224/1148; H01L 2924/12041; H01L 2224/03022; H01L 2224/13024; H01L 2224/13111

See application file for complete search history.

(56) References Cited

U.S. PATENT DOCUMENTS

2001/0040290 A1  11/2001  Sakurai et al.
2002/0121703 A1*  9/2002  Toyoda ............. H01L 21/76834
                                                           257/762

(Continued)

FOREIGN PATENT DOCUMENTS

TW        558821 B       10/2003
TW     200847368 A       12/2008

OTHER PUBLICATIONS

Taiwanese Office Action dated Apr. 6, 2016.

*Primary Examiner* — Carl Arbes
(74) *Attorney, Agent, or Firm* — Rabin & Berdo, P.C.

(57) ABSTRACT

A wiring structure for improving a crown-like defect and a fabrication method thereof are provided. The method includes the following steps. A substrate, on which a seed layer and a patterned photoresist layer with an opening are formed, is provided. A copper layer, having a bottom covering the seed layer, is formed in the opening. A barrier layer covering at least one top portion of the copper layer is formed on the copper layer. An oxidation potential of the barrier layer is greater than that of the copper layer. The patterned photoresist layer is removed to perform an etching process, wherein the copper layer and a portion of the seed layer exposed are etched to form a wiring layer. An immersion process is performed to form an anti-oxidation layer comprehensively on exposed surfaces of the barrier layer and the wiring layer.

6 Claims, 3 Drawing Sheets

(51) Int. Cl.
   H01L 21/768 (2006.01)
   H01L 23/532 (2006.01)
   H05K 3/40 (2006.01)
   H05K 3/24 (2006.01)
   H01L 23/00 (2006.01)

(52) U.S. Cl.
   CPC ... H01L 21/76852 (2013.01); H01L 21/76885 (2013.01); H01L 23/53238 (2013.01); H01L 24/05 (2013.01); H05K 3/4007 (2013.01); H01L 24/11 (2013.01); H01L 24/13 (2013.01); H01L 2224/0235 (2013.01); H01L 2224/0239 (2013.01); H01L 2224/02311 (2013.01); H01L 2224/02313 (2013.01); H01L 2224/02317 (2013.01); H01L 2224/02319 (2013.01); H01L 2224/02331 (2013.01); H01L 2224/0401 (2013.01); H01L 2224/05548 (2013.01); H01L 2224/1148 (2013.01); H01L 2224/13022 (2013.01); H01L 2224/13024 (2013.01); H01L 2224/13111 (2013.01); H01L 2924/01029 (2013.01); H01L 2924/12041 (2013.01); H05K 3/244 (2013.01); H05K 2201/0367 (2013.01)

(56) References Cited

U.S. PATENT DOCUMENTS

| | | |
|---|---|---|
| 2003/0127743 A1 | 7/2003 | Brintzinger |
| 2003/0222352 A1 | 12/2003 | Kung et al. |
| 2004/0166661 A1 | 8/2004 | Lei |
| 2005/0003649 A1 | 1/2005 | Takao |
| 2006/0017160 A1 | 1/2006 | Huang |
| 2006/0214296 A1 | 9/2006 | Okamoto et al. |
| 2010/0309641 A1 | 12/2010 | Hata et al. |

* cited by examiner

FABRICATION METHOD OF WIRING STRUCTURE FOR IMPROVING CROWN-LIKE DEFECT

This application is a divisional application of co-pending U.S. application Ser. No. 13/300,392, filed Nov. 18, 2011. This application claims the benefit of US provisional application Ser. No. 61/415,079, filed Nov. 18, 2010, the subject matter of which is incorporated herein by reference.

BACKGROUND OF THE INVENTION

1. Field of the Invention

The invention relates in general to a wiring structure and a fabrication method thereof, and more particularly to a wiring structure for improving a crown-like defect and a fabrication method thereof.

2. Description of the Related Art

With the narrowing of the line width of copper wires, the difficulty of photo-lithography and etching process is gradually increased. Thus, misalignment or over etching phenomenon tends to occur so that the throughput of chips is decreased and the wires tend to encounter the problem of the crown-like defect. One of the reasons of generating the crown-like defect is that the copper wire has the Galvanic reaction when the exposed copper wire and the gold-plated layer on the wiring surface concurrently contact with the etchant because the copper and the gold have different oxidation potentials. In other words, the metal materials with different oxidation potentials concurrently in the etchant produce the electrochemical reaction due to the potential difference. The metal (e.g., the copper) with the high oxidation potential forms the anode, and the metal (e.g., the gold) with the low oxidation potential forms the cathode. The copper metal with the high oxidation potential forms copper ions dissolved into the etchant in the electrochemical reaction. Thus, the bottom of the copper wire is rapidly eroded to cause the crown-like defect. In addition, the copper ions in the etchant obtain the electrons and are then reproduced and deposited on the metal with the low oxidation potential, thereby darkening the color of the gold-plated layer. The above-mentioned wire etching process still has to be improved.

SUMMARY OF THE INVENTION

The invention is directed to a wiring structure for improving the crown-like defect and a fabrication method thereof to avoid the Galvanic reaction and the coloring of the anti-oxidation layer.

According to a first aspect of the present invention, a wiring structure for improving a crown-like defect is provided. The wiring structure includes a substrate, a seed layer, a copper layer, a barrier layer and an anti-oxidation layer. The seed layer is formed on the substrate. The copper layer is formed on the seed layer. The copper layer and a portion of the seed seed layer are etched to form a wiring layer. The barrier layer covers at least a top portion of the copper layer. An oxidation potential of the barrier layer is greater than an oxidation potential of the copper layer. The anti-oxidation layer comprehensively covers exposed surfaces of the barrier layer and the wiring layer.

According to a second aspect of the present invention, a fabrication method of a wiring structure for improving a crown-like defect is provided. The method includes the following steps. First, a substrate, on which a seed layer and a patterned photoresist layer with an opening are formed, is provided. Next, a copper layer is formed in the opening, wherein the copper layer has a bottom covering the seed layer. Then, a barrier layer is formed on the copper layer, wherein the barrier layer covers at least a top portion of the copper layer, and an oxidation potential of the barrier layer is greater than an oxidation potential of the copper layer. Next, the patterned photoresist layer is removed to perform an etching process, wherein the copper layer and a portion of the seed layer exposed are etched to form a wiring layer. Then, an immersion process is performed to form an anti-oxidation layer comprehensively on exposed surfaces of the barrier layer and the wiring layer.

The above and other aspects of the invention will become better understood with regard to the following detailed description of the preferred but non-limiting embodiment(s). The following description is made with reference to the accompanying drawings.

DETAILED DESCRIPTION OF THE INVENTION

Figure 1:
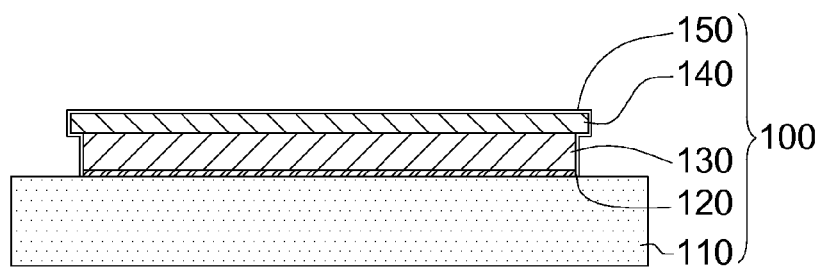
FIG. 1 is a schematic cross-sectional view showing a wiring structure for improving a crown-like defect according to an embodiment.
Figure 2:
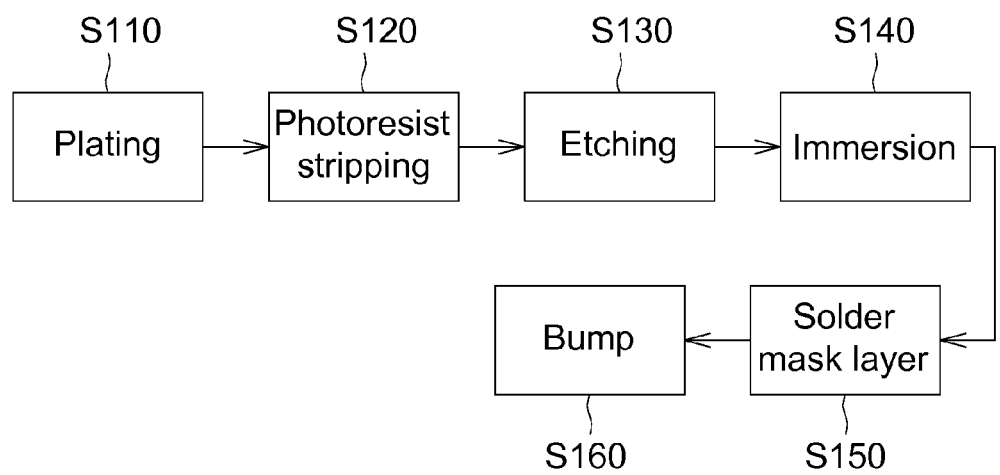
FIG. 2 is a flowchart showing a fabrication method of the wiring structure for improving the crown-like defect according to an embodiment.

FIG. 1 is a schematic cross-sectional view showing a wiring structure for improving a crown-like defect according to an embodiment. FIG. 2 is a flowchart showing a fabrication method of the wiring structure for improving the crown-like defect according to an embodiment. Referring to FIGS. 1 and 2, the wiring structure 100 includes a substrate 110, a seed layer 120, a copper layer 130, a barrier layer 140 and an anti-oxidation layer 150. The copper layer 130 is formed on the seed layer 120. The copper layer 130 and a portion of the seed layer 120 are etched to form a wiring layer 132. The barrier layer 140 covers at least a top portion 131 of the copper layer 130. An oxidation potential of the barrier layer 140 is greater than an oxidation potential of the copper layer 130. The anti-oxidation layer 150 covers comprehensively on exposed surfaces of the barrier layer 140 and the wiring layer 132.

Referring to FIGS. 1 and 2, the fabrication method includes steps S110 to S160, wherein the step S110 is a plating step for forming the copper layer 130 with the predetermined thickness on the seed layer 120 and forming the barrier layer 140 on the top portion 131 of the copper layer 130. The step S120 is a photoresist (PR) stripping step for stripping the patterned photoresist layer covering the seed layer 120. The step S130 is an etching step, such as a wet etching step, for etching the copper layer 130 and a portion of the seed layer 120 to form the wiring layer 132 with a predetermined line width. The step S140 is an immersion step for forming the anti-oxidation layer 150 to comprehensively cover the exposed surfaces of the barrier layer 140 and the wiring layer 132.

Figure 3:
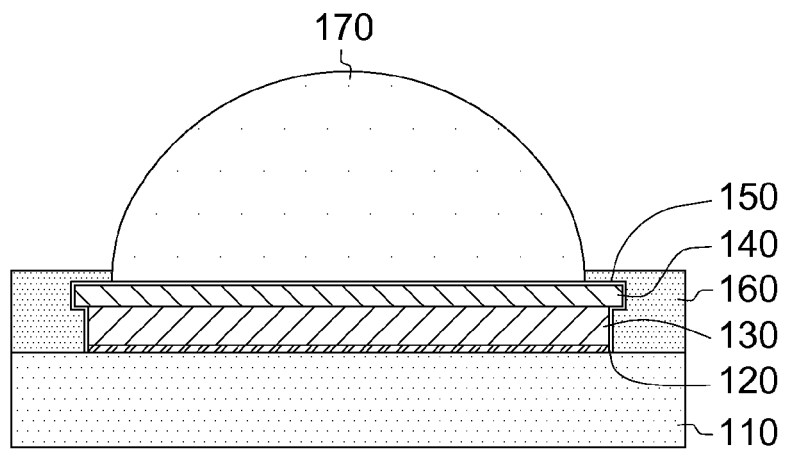
FIG. 3 is a schematic cross-sectional view showing a wiring structure for improving a crown-like defect according to an embodiment.

FIG. 3 is a schematic cross-sectional view showing a wiring structure for improving a crown-like defect according to an embodiment. As shown in FIGS. 2 and 3, in the step S150, a solder mask layer 160 may further be formed on the substrate 110, wherein the solder mask layer 160 covers at least the sidewalls of the wiring layer 132 and the barrier layer 140, on which the anti-oxidation layer 150 is formed. In addition, in the step S160, a solder bump 170 may further be formed on an upper surface 141 of the barrier layer 140 on which the anti-oxidation layer 150 is formed. The solder bump 170 is, for example, a tin-lead bump, or is made of the metal material selected from the group consisting of tin, silver and copper to form a lead-free bump.

In one embodiment, the material of the barrier layer 140 is, for example, nickel or a metal with the oxidation potential greater than that of copper, and the material of the seed layer 120 is, for example, copper. In the etching process of the step S130, when the exposed seed layer 120 and copper layer 130 contact with the etchant, the exposed seed layer 120 and copper layer 130 form copper ions dissolved into the etchant to form the wiring layer 132 due to the electrochemical reaction in the etchant. The etchant may be the chemical etchant, such as the solution of copper chloride and hydrochloric acid, the ferric chloride solution, the solution of sulfuric acid and peroxide, the ammonium persulfate solution or the like. In addition, because the barrier layer 140 has no electrochemical reaction with the copper etchant, the top portion 131 of the copper layer 130 is protected by the barrier layer 140. In addition, because the oxidation potential of the barrier layer 140 is greater than the oxidation potential of the copper, the barrier layer 140 forms the anode for the oxidation, and the copper layer 130 forms the cathode for the reproduction, so that the copper layer 130 is not prone to the Galvanic reaction and is not eroded, and the condition that the bottom of the copper layer 130 is rapidly eroded to have the crown-like defect can be suppressed.

FIGS. 4A to 4E are flowcharts showing a fabrication method of a wiring structure for improving the crown-like defect according to an embodiment. As shown in FIGS. 2 and 4A to 4E and according to the process order of FIG. 2, the fabrication method includes the following steps. First, in FIG. 4A, a substrate 110, on which a seed layer 120 and a patterned photoresist layer 112 with an opening 112a are formed, is provided. Second, in FIG. 4B, a copper layer 130 is formed in the opening 112a and a barrier layer 140 is formed on the copper layer 130, wherein the bottom of the copper layer 130 covers the seed layer 120, the barrier layer 140 covers at least a top portion 131 of the copper layer 130, and the oxidation potential of the barrier layer 140 is greater than the oxidation potential of the copper layer 130. Third, in FIG. 4C, the patterned photoresist layer 112 is removed to perform an etching process, wherein the copper layer 130 and a portion of the seed layer 120 are etched to form a wiring layer 132. Fourth, in FIG. 4D, an immersion process is performed to form an anti-oxidation layer 150 comprehensively on exposed surfaces of the barrier layer 140 and the wiring layer 132.

Figure 4A:
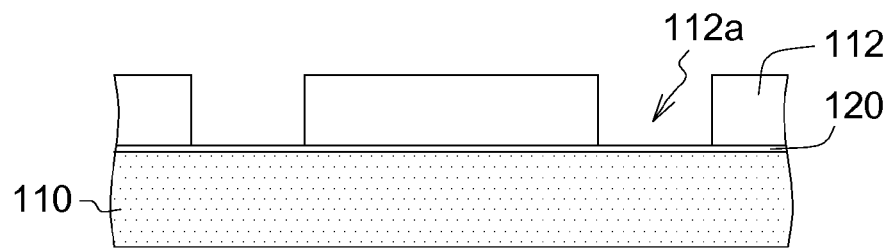
FIGS. 4A to 4E are flowcharts showing a fabrication method of a wiring structure for improving the crown-like defect according to an embodiment.

As shown in FIG. 4A, the substrate 110 may be a semiconductor substrate formed of silicon or gallium arsenide, or may be any other circuit board, in which the proper circuit is formed to serve as an integrated circuit chip, a light emitting diode chip, a photosensitive chip or a printed circuit board. Next, a seed layer 120 is formed on the substrate 110. The material of the seed layer 120 is, for example, copper, formed on the substrate 110 by way of sputtering or electroless plating. Then, a patterned photoresist layer 112 is formed on the seed layer 120 by way of spin coating, laminating or printing. Next, a patterning process is performed to remove a portion of the photoresist layer by way of exposure, development, and to form an opening 112a with a predetermined size.

Figure 4B:
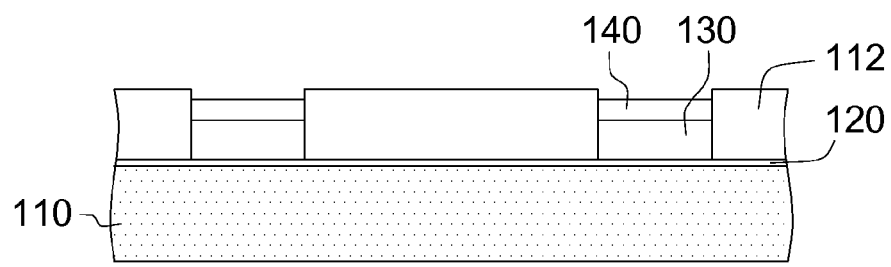

Then, as shown in FIG. 4B, a copper layer 130 is formed in the opening 112a. The copper layer 130 is formed by, for example, the reproduction and deposition of the copper ions of the copper sulfate plating solution on the seed layer 120 in the opening 112a to form a wiring pattern. Next, a barrier layer 140 is formed on the copper layer 130. For example, the barrier layer 140 is formed on the top portion 131 of the copper layer 130 by way of plating or electroless plating. In one embodiment, the barrier layer 140 is made of, for example, nickel, which can decrease the surface oxidation of the copper wire, and may be combined with the copper wire to form a copper-nickel alloy layer to improve the influence caused by the electromigration of the copper wire.

Figure 4C:
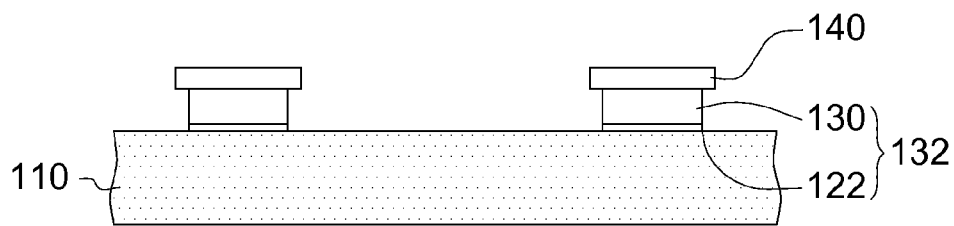

Next, as shown in FIG. 4C, the patterned photoresist layer 112 is removed to perform an etching process. As mentioned hereinabove, when the exposed seed layer 120, copper layer 130 and barrier layer 140 concurrently contact with the etchant, the exposed seed layer 120 and copper layer 130 form copper ions dissolved into the etchant due to the electrochemical reaction of the etchant. The seed layer 120 is etched to form a bottom metal layer 122 having the width substantially equal to the width of the copper layer 130. The bottom metal layer 122 and the copper layer 130 commonly form a wiring layer 132 with the predetermined line width.

In addition, when the etching process is performed, the barrier layer 140 forms the anode for oxidation while the copper layer 130 forms the cathode for reproduction because the oxidation potential of the barrier layer 140 is greater than the oxidation potential of the copper. Thus, the copper layer 130 is not prone to the Galvanic reaction and is not eroded, and the condition that the bottom of the copper layer 130 is rapidly eroded to have the crown-like defect can be suppressed.

Figure 4D:
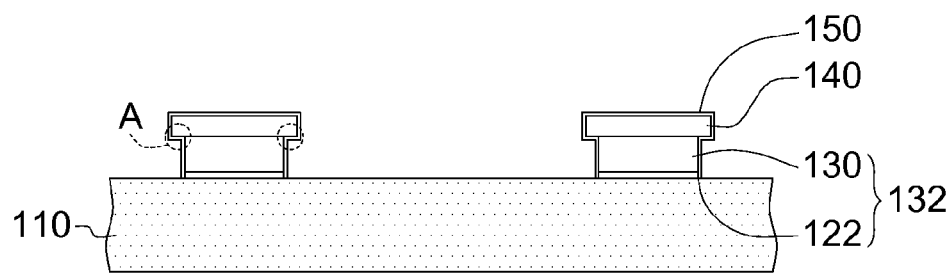

Next, as shown in FIG. 4D, an immersion process is performed to form the anti-oxidation layer 150. The material of the anti-oxidation layer 150 is, for example, gold, which generates electrostatic charge absorption or ion exchange thorough the metal ions of the electrolyte, and absorbs the electrons provided by the reductant and thus distributed comprehensively on the exposed surfaces of the barrier layer 140 and the wiring layer 132. In one embodiment, the anti-oxidation layer 150 produced by the immersion deposition of the electroless plating has the self-catalytic property. No matter which geometric shape of the surface to be plated is, its coating thickness can be uniform, and the exposed lower surface of the barrier layer 140 and the side surface of the inward depressed wiring layer 132 can be plated. Thus, the anti-oxidation layer 150 can prevent the lower surface of the barrier layer 140 and the side surface of the wiring layer 132 from forming the oxidation or, as shown in the area A of FIG. 1.

In addition, because the anti-oxidation layer (gold-plated layer) 150 is formed after the etching process, the conventional condition that the copper with the oxidation potential higher than that of the gold is dissolved into the etchant due to the Galvanic reaction cannot occur when the exposed seed layer 120 and copper layer 130 are being etched. Thus, the crown-like defect caused by the erosion of the bottom of the copper wire cannot occur. In addition, the conventional condition that the copper ions in the etchant obtain the electrons and are reproduced and deposited on the gold-plated layer to darken the color of the gold-plated layer also cannot occur.

Figure 4E:
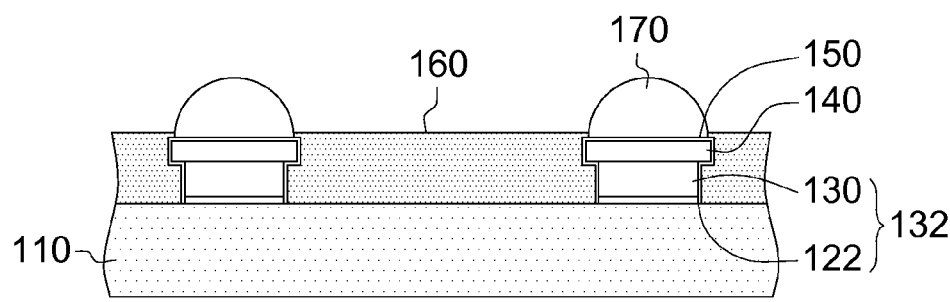

Then, as shown in FIG. 4E, a solder mask layer 160 may further be formed on the substrate 110. The solder mask layer 160 covers at least the sidewalls, on which the anti-oxidation wiring layer 132 and barrier layer 140 are formed. In addition, a solder bump 170 may further be formed on an upper surface of the barrier layer 140, on which the anti-oxidation layer 150 is formed. The solder bump 170 is, for example, a tin-lead bump, or is made of the metal material selected from the group consisting of tin, silver and copper to form a lead-free bump.

In the wiring structure for improving the crown-like defect and the fabrication method thereof according to the embodiment of the invention, the oxidation potential of the barrier layer is greater than that of the copper layer so that the erosion of the copper layer due to the Galvanic reaction is prevented, and the condition that the bottom of the copper layer is rapidly eroded to have the crown-like defect can be suppressed. In addition, the anti-oxidation layer is formed after the etching process, the anti-oxidation layer is free from the coloring problem, and the ability against the anti-oxidation coloring of the wire can be enhanced.

While the invention has been described by way of example and in terms of the preferred embodiment(s), it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A method of fabricating a wiring structure for improving a crown-like defect, the method comprising the steps of:
    providing a substrate on which a seed layer and a patterned photoresist layer with an opening are formed;
    forming a copper layer in the opening, wherein the copper layer has a bottom covering the seed layer;
    forming a barrier layer on the copper layer, wherein the barrier layer covers at least a top portion of the copper layer, and an oxidation potential of the barrier layer is greater than an oxidation potential of the copper layer;
    removing the patterned photoresist layer to perform an etching process, wherein the copper layer and a portion of the seed layer exposed are etched to form a wiring layer; and
    performing an immersion process to form an anti-oxidation layer comprehensively on exposed surfaces of the barrier layer and the wiring layer, wherein the exposed surfaces of the barrier layer comprise an exposed bottom surface.

2. The method according to claim 1, further comprising the step of:
    forming a solder mask layer on the substrate, wherein the solder mask layer covers at least sidewalls of the wiring layer and the barrier layer, on which the anti-oxidation layer is formed.

3. The method according to claim 1, further comprising a step of:
    forming a solder bump on an upper surface of the barrier layer covered by the anti-oxidation layer.

4. The method according to claim 3, wherein a material of the solder bump is selected from the group consisting of tin, silver, copper, gold and a combination thereof.

5. The method according to claim 1, wherein a material of the barrier layer is nickel.

6. The method according to claim 1, wherein a material of the anti-oxidation layer is gold.

\* \* \* \* \*